United States Patent
Machida

(10) Patent No.: US 11,953,269 B2
(45) Date of Patent: Apr. 9, 2024

(54) LOOP HEAT PIPE

(71) Applicant: SHINKO ELECTRIC INDUSTRIES CO., LTD., Nagano (JP)

(72) Inventor: Yoshihiro Machida, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 30 days.

(21) Appl. No.: 17/667,979

(22) Filed: Feb. 9, 2022

(65) Prior Publication Data

US 2022/0260323 A1   Aug. 18, 2022

(30) Foreign Application Priority Data

Feb. 12, 2021  (JP) ................... 2021-021232

(51) Int. Cl.
| | | |
|---|---|---|
| *F28D 15/04* | (2006.01) | |
| *F28D 15/02* | (2006.01) | |
| *H05K 7/20* | (2006.01) | |

(52) U.S. Cl.
CPC ....... *F28D 15/046* (2013.01); *F28D 15/0266* (2013.01); *F28D 15/043* (2013.01); *H05K 7/20336* (2013.01)

(58) Field of Classification Search
CPC ........ F28D 15/04; F28D 15/02; F28D 15/046; F28D 15/043; F28D 15/0266; F28F 3/086; F28F 2275/02; H05K 7/20336; H05K 7/20
See application file for complete search history.

(56) References Cited

U.S. PATENT DOCUMENTS

| | | |
|---|---|---|
| 2018/0058767 A1 | 3/2018 | Machida et al. |
| 2019/0242652 A1* | 8/2019 | Machida ............. F28D 15/0266 |
| 2019/0242653 A1 | 8/2019 | Machida |
| 2019/0293362 A1 | 9/2019 | Machida |
| 2019/0368820 A1 | 12/2019 | Machida |

FOREIGN PATENT DOCUMENTS

| | | |
|---|---|---|
| JP | 6291000 | 2/2018 |
| JP | 6400240 | 9/2018 |

OTHER PUBLICATIONS

Extended European Search Report dated Jun. 20, 2022 for corresponding European Application No. 22 15 5420; English text (5 pages).

* cited by examiner

*Primary Examiner* — Harry E Arant
(74) *Attorney, Agent, or Firm* — Rankin, Hill & Clark LLP

(57) ABSTRACT

A loop heat pipe includes: an evaporator; a condenser; a liquid pipe; a vapor pipe; and a loop-like flow channel through which the working fluid flows. At least one of the evaporator, the condenser, the liquid pipe, and the vapor pipe includes a first outer metal layer, a second outer metal layer, and an inner metal layer. The inner metal layer includes a porous body. The porous body includes: a first bottomed hole formed in one face of the inner metal layer; a second bottomed hole formed in the other face of the inner metal layer; a pore, wherein the first bottomed hole and the second bottomed hole partially communicates with each other through the pore; and a first column portion provided inside the first bottomed hole. The first column portion is bonded to the first outer metal layer.

10 Claims, 8 Drawing Sheets

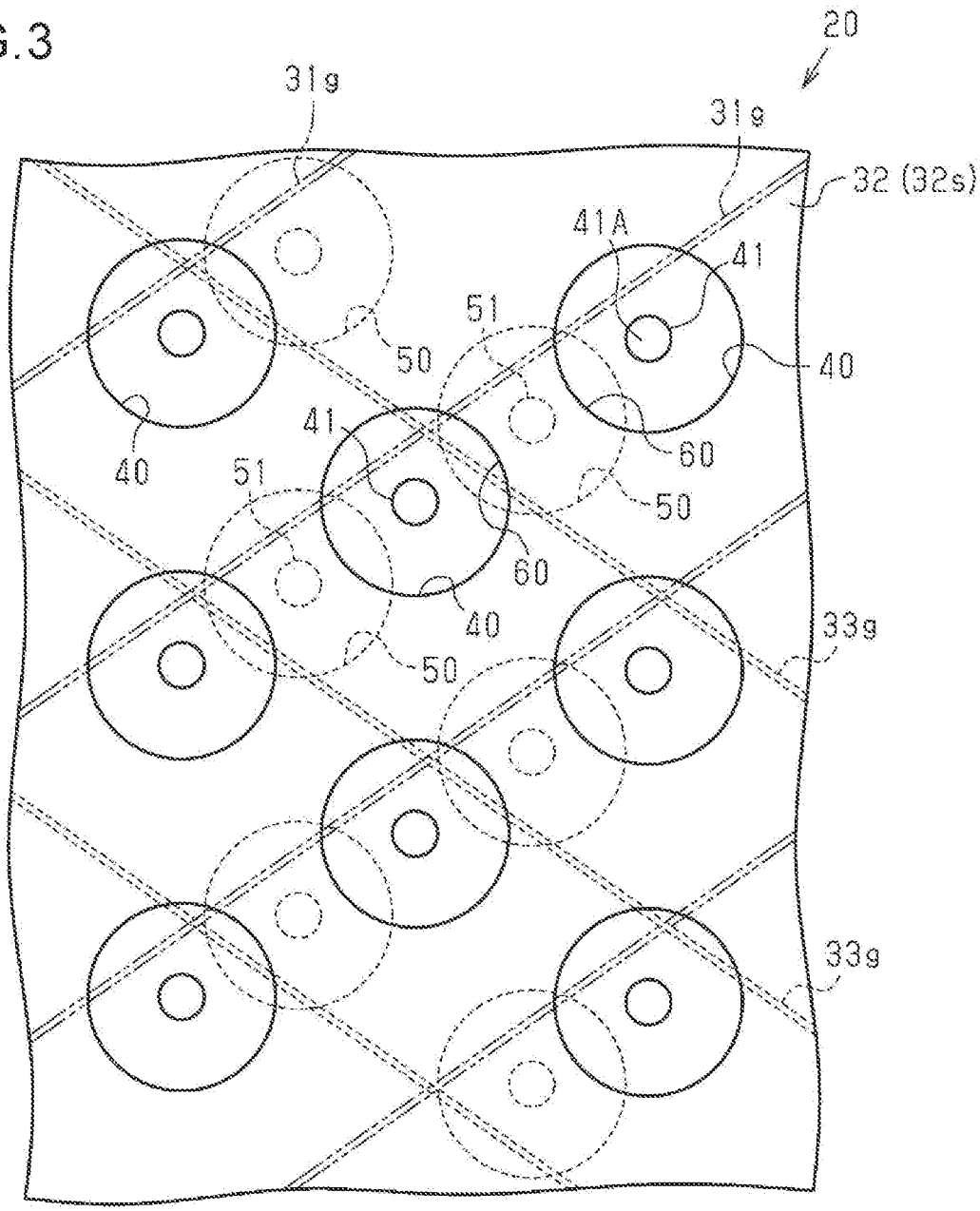

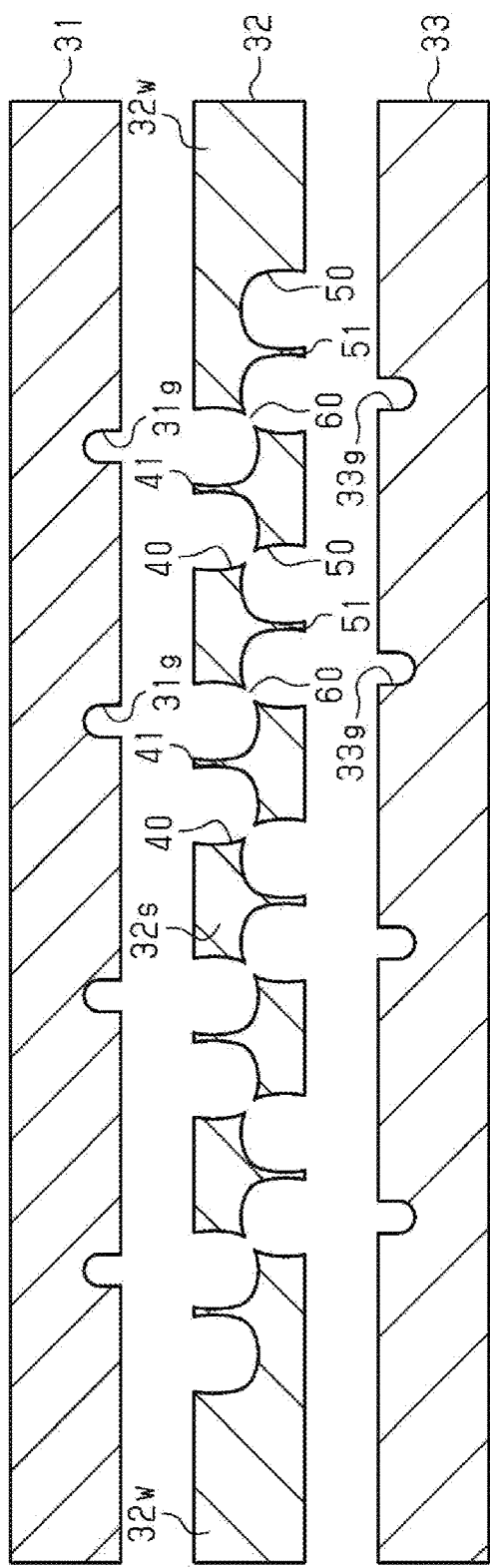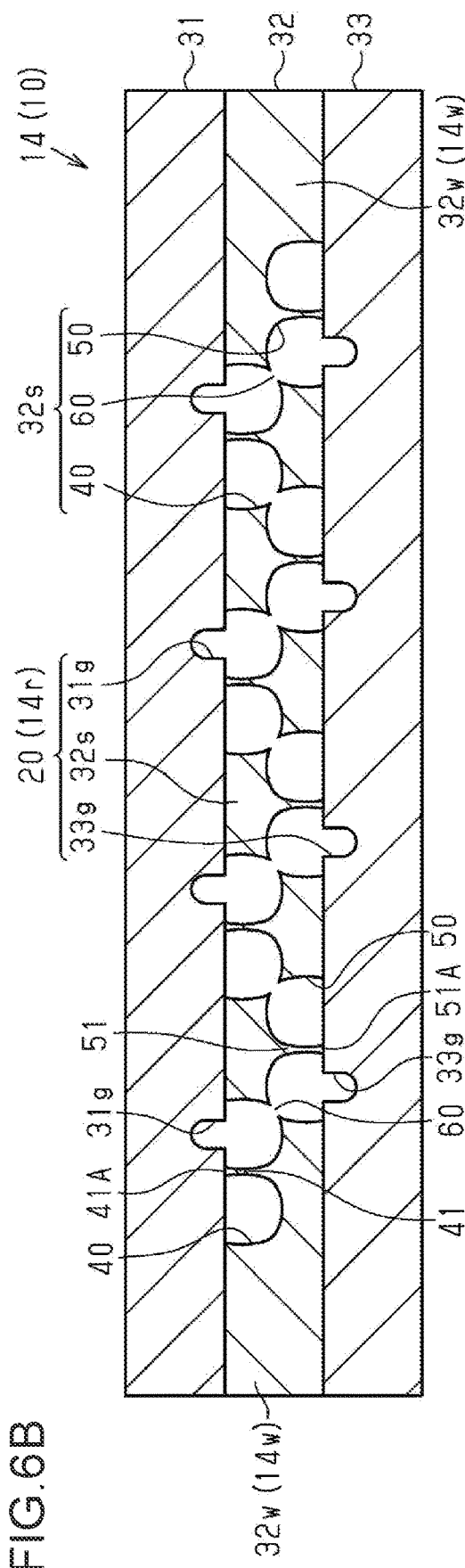

LOOP HEAT PIPE

BACKGROUND

This application claims priority from Japanese Patent Applications No. 2021-021232, filed on Feb. 12, 2021, the entire contents of which are herein incorporated by reference.

Technical Field

The present disclosure relates to a loop heat pipe.

Background Art

In the background art, a heat pipe that transports heat using a phase change of a working fluid has been proposed as a device for cooling a heating component of a semiconductor device (such as a CPU) mounted on an electronic apparatus (e.g. see JP Patent No. 6291000 and JP Patent No. 6400240).

As an example of such a heat pipe, there has been known a loop heat pipe including an evaporator that vaporizes a working fluid by heat of a heating component, and a condenser that cools and condenses the vaporized working fluid. In the loop heat pipe, the evaporator and the condenser are connected to each other through a liquid pipe and a vapor pipe, that form a loop-like flow channel. In the loop heat pipe, the working fluid flows through the loop-like flow channel in one direction.

The flow channel is formed by metal layers stacked on one another. The metal layers have a pair of outer metal layers that are provided at opposite ends in a direction in which the metal layers are stacked, and a plurality of inner metal layers that are provided between the pair of outer metal layers. A porous body including pores is provided in the inner metal layers. The pores are formed by such partial communication that bottomed holes recessed from one side of each of the inner metal layers partially communicate with bottomed holes recessed from the other side of the inner metal layer. One end side of the inner metal layers in their stacking direction is bonded to one of the outer metal layers, and the other end side of the inner metal layers in their stacking direction is bonded to the other outer metal layer.

By the way, when the working fluid in a liquid phase is vaporized, volume expansion may occur in the loop heat pipe in accordance with characteristics of the working fluid sealed inside the flow channel. Further, when an ambient temperature of the loop heat pipe is lower than a freezing point of the working fluid, the working fluid freezes and solidifies in the loop heat pipe. On this occasion, volume expansion may occur as the working fluid undergoes a liquid-to-solid phase change. When such volume expansion occurs, the outer metal layers may be deformed to expand outwardly so that the outer metal layers are separated from the inner metal layers.

SUMMARY

Certain embodiment provides a loop heat pipe.
The loop heat pipe comprises:
an evaporator that vaporizes a working fluid;
a condenser that condenses the working fluid;
a liquid pipe that connects the evaporator and the condenser to each other;
a vapor pipe that connects the evaporator and the condenser to each other; and
a loop-like flow channel that is provided in each of the evaporator, the condenser, the liquid pipe, and the vapor pipe, and through which the working fluid flows.

At least one of the evaporator, the condenser, the liquid pipe, and the vapor pipe comprises a first outer metal layer, a second outer metal layer, and an inner metal layer that is provided between the first outer metal layer and the second outer metal layer.

The inner metal layer comprises a porous body.
The porous body comprises:
a first bottomed hole formed in one face of the inner metal layer;
a second bottomed hole formed in the other face of the inner metal layer;
a pore, wherein the first bottomed hole and the second bottomed hole partially communicates with each other through the pore; and
a first column portion provided inside the first bottomed hole, wherein the first column portion is bonded to the first outer metal layer.

BRIEF DESCRIPTION OF DRAWINGS

FIG. 3 is a schematic plan view showing a porous body according to the embodiment;

FIG. 6A and FIG. 6B are schematic sectional views showing the method for manufacturing the loop heat pipe according to the embodiment;

DETAILED DESCRIPTION OF EMBODIMENT

An embodiment will be described below with reference to the accompanying drawings. Incidentally, for convenience, the accompanying drawings may show each characteristic portion in an enlarged manner in order to make the characteristic easy to understand, and a dimensional ratio among constituent elements may be different among the drawings. Further, in order to make sectional structures of members easy to understand in sectional view, some of the members to be hatched will be not hatched but drawn in a satin pattern. Incidentally, in the present specification, the expression "plan view" means a view of an object from a vertical direction (illustrated up/down direction) of FIGS. 2A and 2B and the like, and the expression "planar shape" means a shape of the object from the vertical direction of FIGS. 2A and 2B and the like. Further, the expressions "up/down direction" and "left/right direction" in the present specification are directions when, of each drawing, a side in which reference signs indicating the members can be accurately read is set at a normal position.

Figure 1:
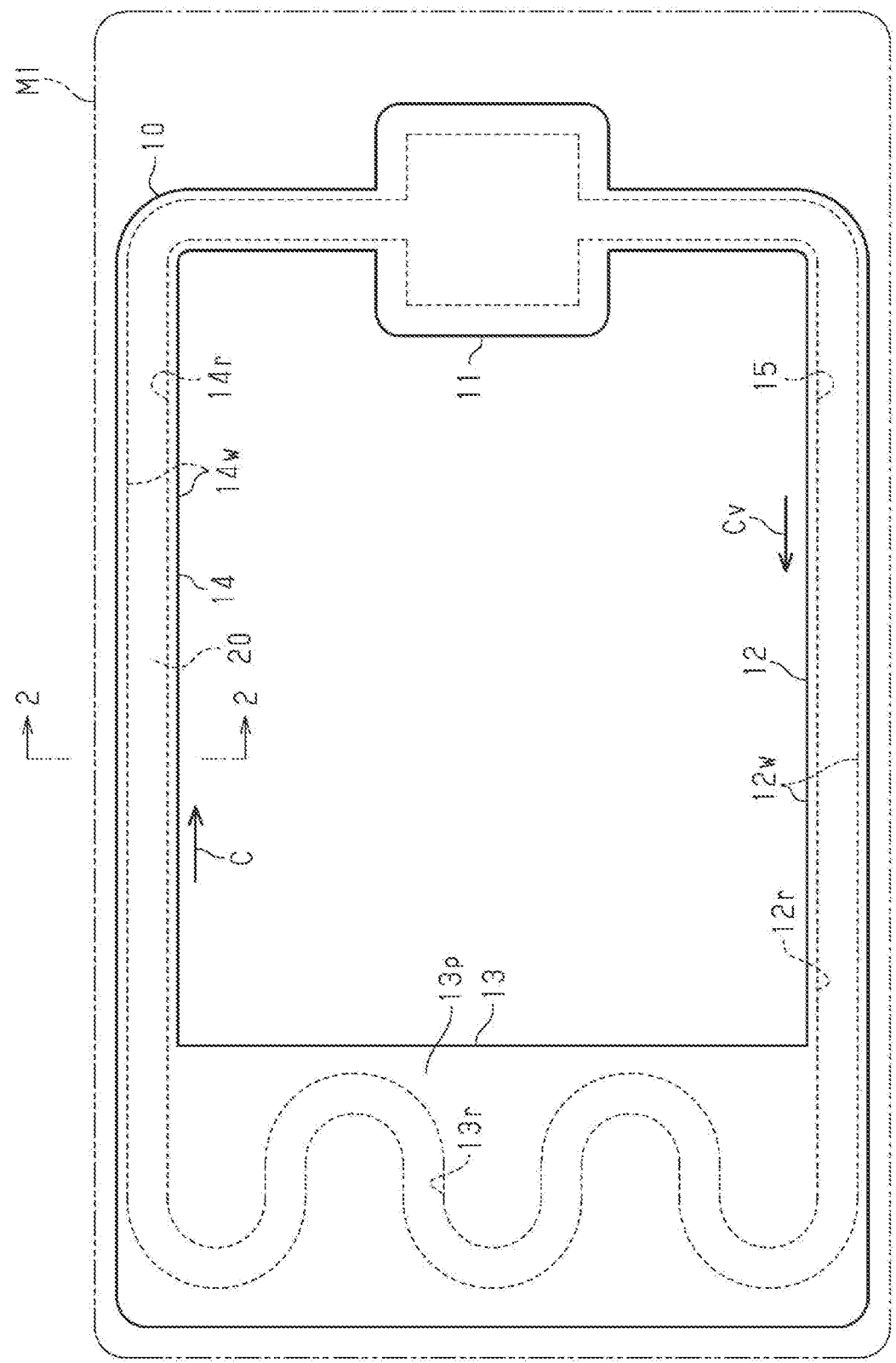
FIG. 1 is a schematic plan view showing a loop heat pipe according to an embodiment.

A loop heat pipe 10 shown in FIG. 1 is, for example, accommodated in a mobile electronic device M1 such as a smartphone or a tablet terminal. The loop heat pipe 10 has an evaporator 11, a vapor pipe 12, a condenser 13, and a liquid pipe 14.

The evaporator 11 and the condenser 13 are connected to each other by the vapor pipe 12 and the liquid pipe 14. The evaporator 11 has a function of vaporizing a working fluid C to generate vapor Cv. The vapor Cv generated in the evaporator 11 is sent to the condenser 13 through the vapor pipe 12. The condenser 13 has a function of condensing the vapor Cv of the working fluid C. The condensed working fluid C is sent to the evaporator 11 through the liquid pipe 14. The vapor pipe 12 and the liquid pipe 14 form a loop-like flow channel 15 through which the working fluid C or the vapor Cv is made to flow.

The vapor pipe 12 is, for example, formed into a long tubular body. The liquid pipe 14 is, for example, formed into a long tubular body. In the present embodiment, the vapor pipe 12 and the liquid pipe 14 are, for example, the same in dimension in a length direction (i.e. length) as each other, Incidentally, the length of the vapor pipe 12 and the length of the liquid pipe 14 may be different from each other. For example, the length of the vapor pipe 12 may be shorter than the length of the liquid pipe 14. Here, the "length direction" of the evaporator 11, the vapor pipe 12, the condenser 13, and the liquid pipe 14 in the present specification is a direction consistent with a direction (see arrows in FIG. 1) in which the working fluid C or the vapor Cv in each member flows.

The evaporator 11 is fixed in close contact with a heating component (not shown). The working fluid C in the evaporator 11 is vaporized by heat generated by the heating component, so that the vapor Cv is generated. Incidentally, a thermal interface material (TIM) may be interposed between the evaporator 11 and the heating component. The TIM reduces thermal contact resistance between the heating component and the evaporator 11 to make the heat be conducted from the heating component to the evaporator 11 smoothly.

The vapor pipe 12 has, for example, a pair of pipe walls 12w that are provided on opposite sides in a width direction of the vapor pipe 12 orthogonal to the length direction of the vapor pipe 12 in plan view, and a flow channel 12r that is provided between the pair of pipe walls 12w. The flow channel 12r communicates with an internal space of the evaporator 11. The flow channel 12r is a part of the loop-like flow channel 15. The vapor Cv generated in the evaporator 11 is guided to the condenser 13 through the vapor pipe 12.

The condenser 13 has, for example, a heat dissipating plate 13p whose area has been increased for heat dissipation, and a flow channel 13r that meanders inside the heat dissipating plate 13p. The flow channel 13r is a part of the loop-like flow channel 15. The vapor Cv guided through the vapor pipe 12 is condensed in the condenser 13.

The liquid pipe 14 has, for example, a pair of pipe walls 14w that are provided on opposite sides in a width direction of the liquid pipe 14 orthogonal to the length direction of the liquid pipe 14 in plan view, and a flow channel 14r that is provided between the pair of pipe walls 14w. The flow channel 14r communicates with the flow channel 13r of the condenser 13, and communicates with the internal space of the evaporator 11. The flow channel 14r is a part of the loop-like flow channel 15.

The liquid pipe 14 has a porous body 20. The porous body 20 is, for example, formed to extend from the condenser 13 to the evaporator 11 along the length direction of the liquid pipe 14. The porous body 20 guides the working fluid C condensed in the condenser 13 to the evaporator 11 by capillary force generated in the porous body 20. That is, the working fluid C condensed in the condenser 13 is guided to the evaporator 11 through the liquid pipe 14. Incidentally, although not shown, a porous body similar to or the same as the porous body 20 is also provided in the evaporator 11.

Thus, in the loop heat pipe 10, the heat generated by the heating component is transferred to the condenser 13 and dissipated in the condenser 13. As a result, the heating component is cooled so that an increase in temperature of the heating component can be suppressed.

Here, it is preferable that a fluid high in vapor pressure and large in latent heat of vaporization is used as the working fluid C. By use of such a working fluid C, the heating component can be efficiently cooled by the latent heat of vaporization. For example, ammonia, water, chlorofluorocarbon, alcohol, acetone, or the like, can be used as the working fluid C.

Figure 2A:
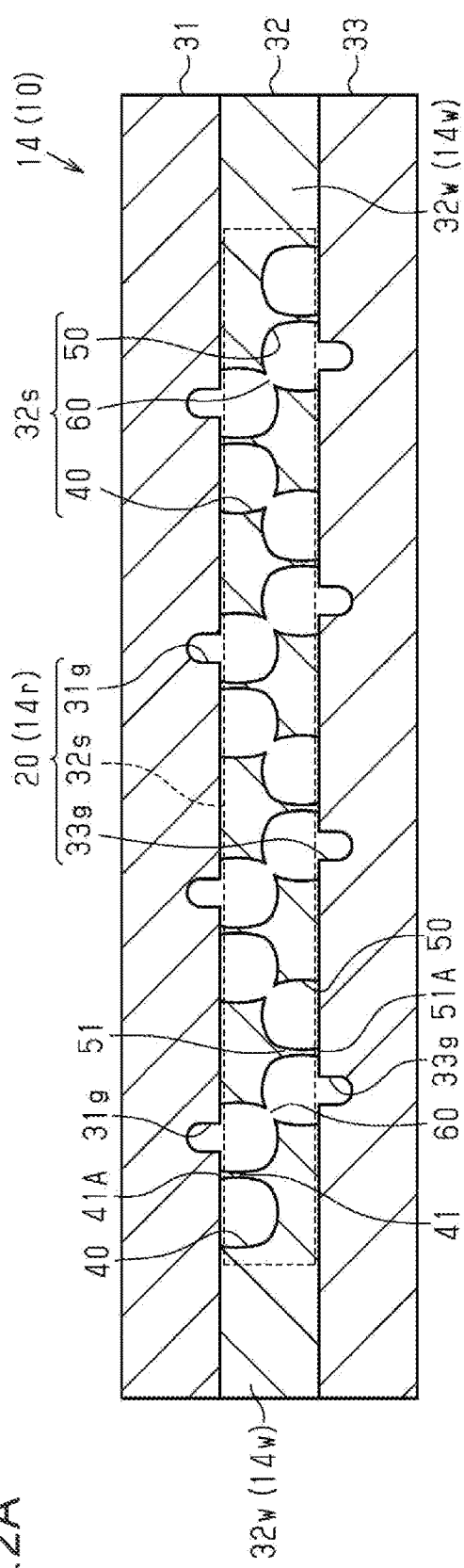
FIG. 2A is a schematic sectional view (sectional view taken along a line 2-2 in FIG. 1) showing a liquid pipe according to the embodiment.
Figure 2B:
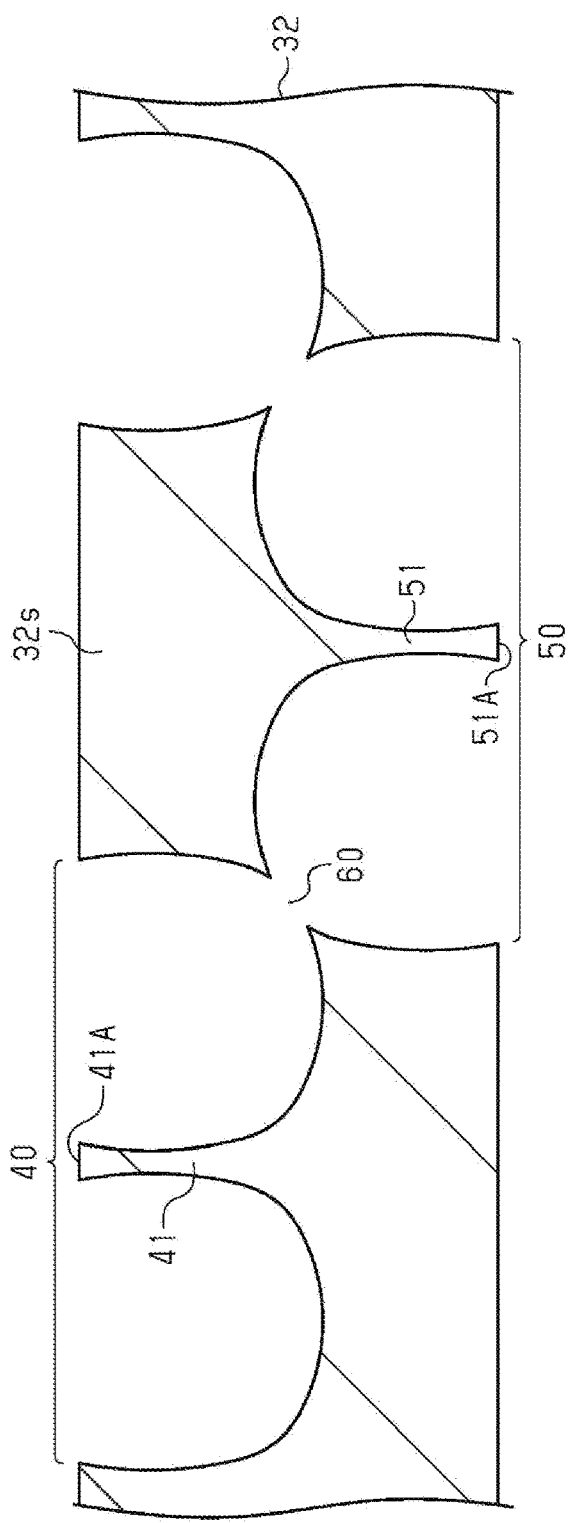
FIG. 2B is an enlarged sectional view in which a portion of the liquid pipe shown in FIG. 2A is enlarged.

FIG. 2A shows a section of the liquid pipe 14 taken along a line 2-2 in FIG. 1. This section is a face orthogonal to the flow direction (the direction indicated by the arrows in FIG. 1) of the working fluid C in the liquid pipe 14. FIG. 2B is an enlarged sectional view in which a portion of the liquid pipe 14 shown in FIG. 2A is enlarged.

As shown in FIG. 2A, the liquid pipe 14 has a structure in which, for example, three metal layers 31, 32, and 33 are stacked on one another. In other words, the liquid pipe 14 has a structure in which the metal layer 32, which is an inner metal layer, is disposed between the metal layers 31 and 33, which are a pair of outer metal layers. The inner metal layer of the liquid pipe 14 in the present embodiment is made up of only one metal layer 32.

Each of the metal layers 31 to 33 is, for example, a copper (Cu) layer having excellent heat conductivity. The metal layers 31 to 33 are, for example, directly bonded to one another by solid-phase bonding such as diffusion bonding, pressure welding, friction welding or ultrasonic bonding. Incidentally, to make it easy to understand in FIG. 2A, the metal layers 31 to 33 are distinguished from one another by a solid line. When, for example, the metal layers 31 to 33 are integrated by the diffusion bonding, an interface between adjacent ones of the metal layers 31 to 33 may disappear so that a boundary therebetween may be unclear. Here, the solid-phase bonding is a method in which objects to be bonded are not melted into each other but softened by heat in a solid-phase (solid) state, and then plastically deformed by further heat to be bonded to each other. Incidentally, each of the metal layers 31 to 33 is not limited to the copper layer, but may be formed of a stainless steel layer, an aluminum layer, a magnesium alloy layer, or the like. Further, a material used for forming some of the stacked metal layers 31 to 33 may be different from a material used for forming the others of the metal layers 31 to 33. Thickness of each of the metal layers 31 to 33 can be, for example, set in a range of about 50 μm to 200 μm. Incidentally, some of the metal layers 31 to 33 may be made different in thickness from the others of the metal layers 31 to 33, or all the metal layers 31 to 33 may be made different in thickness from one another.

The liquid pipe 14 that are made up of the stacked metal layers 31 to 33 has the pair of pipe walls 14w that are provided at the opposite ends in the width direction (left-right direction in FIG. 2A) of the liquid pipe 14 orthogonal to the stacking direction of the metal layers 31 to 33, and the porous body 20 that is provided between the pair of pipe walls 14w. The porous body 20 is, for example, formed in continuity with the pipe walls 14w.

The metal layer 31 is stacked on an upper face of the metal layer 32. One or more grooves 31g are formed in a lower face of the metal layer 31. Each of the grooves 31g is formed so as to be recessed from the lower face of the metal layer 31 to a thicknesswise central portion of the metal layer 31.

The metal layer 32 is provided between the metal layer 31 and the metal layer 33. The upper face of the metal layer 32 is bonded to the lower face of the metal layer 31. A lower face of the metal layer 32 is bonded to an upper face of the metal layer 33. The metal layer 32 has a pair of wall portions 32w that are provided at the widthwise opposite ends of the liquid pipe 14, and a porous body 32s that is provided between the pair of wall portions 32w.

The metal layer 33 is provided on the lower face of the metal layer 32. One or more grooves 33g are formed in the upper face of the metal layer 33. Each of the grooves 33g is formed so as to be recessed from the upper face of the metal layer 33 to a thicknesswise central portion of the metal layer 33.

Next, a specific structure of each of the pipe walls 14w will be described. The pipe walls 14w are, for example, respectively constituted by the wall portions 32w of the metal layer 32, which is the inner metal layer. Each of the pipe walls 14w in the present embodiment is constituted by only the wall portion 32w. No holes or grooves are formed in each of the wall portions 32w.

Next, a specific structure of the porous body 20 will be described.

The porous body 20 has, for example, the porous body 32s belonging to the metal layer 32, which is the inner metal layer, and the grooves 31g and 33g respectively belonging to the metal layers 31 and 33, which are the outer metal layers.

First, a specific structure of the porous body 32s will be described.

The porous body 32s has bottomed holes 40, bottomed holes 50, and pores 60. Each of the bottom holes 40 is recessed from the upper face of the metal layer 32 to a thicknesswise central portion of the metal layer 32. Each of the bottomed holes 50 is recessed from the lower face of the metal layer 32 to a thicknesswise central portion of the metal layer 32. The pores 60 are formed by partial communication between the bottomed holes 40 and the bottomed holes 50. Depth of each of the bottomed holes 40 and 50 can be, for example, set in a range of about 25 µm to 100 µm.

As shown in FIG. 2B, an inner face of the bottomed hole 40, 50 is, for example, formed into a shape that is continuous like an arc from an opening side (upper/lower face side of the metal layer 32) to a bottom face side. An inner side face of the bottomed hole 40, 50 is formed into an arc-shaped curved face in sectional view. The sectional shape of the inner side face of the bottomed hole 40, 50 is, for example, formed into the arc-shaped curved face so that an opening width in the middle of the depth direction of the bottomed hole 40, 50 is widest. A bottom face of the bottomed hole 40, 50 is, for example, formed into an arc-shaped curved face. The bottom face of the bottomed hole 40, 50 is, for example, formed in continuity with the inner side face of the bottomed hole 40, 50. The radius of curvature of the bottom face of the bottomed hole 40, 50 may be equal to the radius of curvature of the inner side face of the bottomed hole 40, 50, or may be different from the radius of curvature of the inner side face of the bottomed hole 40, 50. Herein, the expression "equal" in this specification includes not only a case where the objects to be compared are exactly equal, but also a case where there is some difference between the objects to be compared due to an influence of dimensional tolerance or the like.

Incidentally, the inner face of the bottomed hole 40, 50 may be formed into a concave shape that is a semicircle or a semiellipse in section. Here, the expression "semicircle" in this specification includes not only a semicircle that is a halved part of a perfect circle, but also, for example, an arc that is longer or shorter than the semicircle. In addition, the expression "semiellipse" in this specification includes not only a semiellipse that is a halved part of an ellipse, but also, for example, an arc that is longer or shorter than the semiellipse. Moreover, the inner face of the bottomed hole 40, 50 may be formed into a tapered shape that is wider as it goes from the bottom face side toward the opening side. Moreover, the bottom face of the bottomed hole 40, 50 may be formed into a flat face parallel to the upper face of the metal layer 32, and the inner side face of the bottomed hole 40, 50 may be formed to extend perpendicularly to the bottom face.

As shown in FIG. 3, each of the bottomed holes 40 and 50 is, for example, formed into a circular shape in plan view. The diameter of the bottomed hole 40, 50 can be, for example, set in a range of about 100 µm to 400 µm. Incidentally, the bottomed hole 40, 50 can be formed into any shape such as an ellipse or a polygon in plan view. The bottomed hole 40 and the bottomed hole 50 partially overlap with each other in plan view. As shown in FIG. 2A and FIG. 3, the pore 60 through which the bottomed hole 40 and the bottomed hole 50 partially communicate with each other is formed at the portion where the bottomed hole 40 and the bottomed hole 50 overlap with each other in plan view.

Each of the bottomed holes 40 has a column portion 41 inside. That is, the metal layer 32 has the column portions 41 provided inside the bottomed holes 40 respectively. Each of the column portions 41 is provided apart from an entire circumference of the inner side face of the bottomed hole 40. That is, a space is formed over the entire circumference of the bottomed hole 40 between an outer circumferential face of the column portion 41 and the inner side face of the bottomed hole 40. In other words, the column portion 41 is provided in a central portion of the bottomed hole 40 in plan view. As shown in FIG. 3, the column portion 41 in the present embodiment is provided at the center of the bottomed hole 40 in plan view. The column portion 41 is, for example, provided at a position that does not overlap with any part of the bottomed hole 50 in plan view.

The column portion 41 can be formed into any shape with any size in plan view. The planar shape of the column portion 41 may be a shape equal to the planar shape of the bottomed hole 40, or a shape different from the planar shape of the bottomed hole 40. The planar shape of the column portion 41 can be, for example, set to have a size about 10% to 20% of the size of the planar shape of the bottomed hole 40. For example, the column portion 41 can be shaped like a circle with a diameter of about 10 µm to 50 µm in plan view. In the present embodiment, the column portion 41 is formed into a concentric shape with the inner side face of the bottomed hole 40.

As shown in FIG. 2B, the column portion 41 extends from the bottom face of the bottomed hole 40 to the upper face of the metal layer 32 in the thickness direction of the metal layer 32. An upper face 41A of the column portion 41 is formed on the same plane as the upper face of the metal layer 32. Thickness of the column portion 41 is set to be as long as the depth of the bottomed hole 40. The column portion 41 is formed integrally and in continuity with the metal layer 32 constituting the inner face of the bottomed hole 40.

The column portion 41 has a proximal end and a distal end in the thickness direction of the column portion 41. The proximal end of the column portion 41 is connected to the bottom face of the bottomed hole 40. The distal end of the column portion 41 is provided on an opposite side to the proximal end in the thickness direction of the column portion 41. The distal end of the column portion 41 has the upper face 41A of the column portion 41. The column portion 41 is, for example, formed so that a thicknesswise central portion of the column portion 41 is thinner than each of the proximal end and the distal end of the column portion 41. The column portion 41 is, for example, formed so that the thicknesswise central portion of the column portion 41 is thinnest. The sectional shape of the outer circumferential face of the column portion 41 is formed curvilinearly so as to have "constriction" in the thicknesswise central portion of the column portion 41, The outer circumferential face of the column portion 41 is formed into an arc-shaped cured face in sectional view. The column portion 41 is formed so as to be thicker as it goes from the thicknesswise central portion of the column portion 41 toward the distal end of the column portion 41. The column portion 41 is formed so as to be thicker as it goes from the thicknesswise central portion of the column portion 41 toward the proximal end of the column portion 41. The distal end of the column portion 41 is, for example, formed to be thinner than the proximal end of the column portion 41. The upper face 41A of the column portion 41 is formed into a flat face parallel to the upper face of the metal layer 32.

Each of the bottomed holes 50 has a column portion 51 inside. That is, the metal layer 32 has the column portions 51 provided inside the bottomed holes 50 respectively. Each of the column portions 51 is provided apart from an entire circumference of the inner side face of the bottomed hole 50. That is, a space is formed over the entire circumference of the bottomed hole 50 between an outer circumferential face of the column portion 51 and the inner side face of the bottomed hole 50. In other words, the column portion 51 is provided in a central portion of the bottomed hole 50 in plan view. As shown in FIG. 3, the column portion 51 in the present embodiment is provided at the center of the bottomed hole 50 in plan view. The column portion 51 is, for example, provided at a position that does not overlap with any part of the bottomed hole 40 in plan view.

The column portion 51 can be formed into any shape with any size in plan view. The planar shape of the column portion 51 may be a shape equal to the planar shape of the bottomed hole 50, or a shape different from the planar shape of the bottomed hole 50. The planar shape of the column portion 51 can be, for example, set to have a size about 10% to 20% of the size of the planar shape of the bottomed hole 50, For example, the column portion 51 can be shaped like a circle with a diameter of about 10 μm to 50 μm in plan view. In the present embodiment, the column portion 51 is formed into a concentric shape with the inner side face of the bottomed hole 50.

As shown in FIG. 2B, the column portion 51 extends from the bottom face of the bottomed hole 50 to the upper face of the metal layer 32 in the thickness direction of the metal layer 32. A lower face 51A of the column portion 51 is formed on the same plane as the lower face of the metal layer 32. Thickness of the column portion 51 is set to be as long as the depth of the bottomed hole 50. The column portion 51 is formed integrally and in continuity with the metal layer 32 constituting the inner face of the bottomed hole 50.

The column portion 51 has a proximal end and a distal end in the thickness direction of the column portion 51. The proximal end of the column portion 51 is connected to the bottom face of the bottomed hole 50. The distal end of the column portion 51 has the lower face 51A of the column portion 51. The column portion 51 is, for example, formed so that a thicknesswise central portion of the column portion 51 is thinner than each of the proximal end and the distal end of the column portion 51. The column portion 51 is, for example, formed so that the thicknesswise central portion of the column portion 51 is thinnest. The sectional shape of the outer circumferential face of the column portion 51 is formed curvilinearly so as to have "constriction" in the thicknesswise central portion of the column portion 51. The outer circumferential face of the column portion 51 is formed into an arc-shaped curved face in sectional view. The column portion 51 is formed so as to be thicker as it goes from the thicknesswise central portion of the column portion 51 toward the distal end of the column portion 51. The column portion 51 is formed so as to be thicker as it goes from the thicknesswise central portion of the column portion 51 toward the proximal end of the column portion 51. The distal end of the column portion 51 is, for example, formed to be thinner than the proximal end of the column portion 51. The lower face 51A of the column portion 51 is formed into a flat face parallel to the lower face of the metal layer 32.

As shown in FIG. 2A, the upper face 41A of the column portion 41 is bonded to the lower face of the metal layer 31. For example, the entire upper face 41A of the column portion 41 is bonded to the lower face of the metal layer 31. The lower face 514 of the column portion 51 is bonded to the upper face of the metal layer 33. For example, the entire lower face 51A of the column portion 51 is bonded to the upper face of the metal layer 33.

Next, specific structures of the grooves 31g and 33g will be described.

An inner face of each of the grooves 31g and 33g can be formed into any shape in section. A bottom face of the groove 31g, 33g is, for example, formed into an arc-shaped curved face. An inner side face of the groove 31g, 33g is, for example, formed to extend perpendicularly to the lower face of the metal layer 31. Incidentally, the inner face of the groove 31g, 33g may be formed into a tapered shape that is wider as it goes from a bottom face side toward an opening side. The inner face of the groove 31g, 33g may be formed into a shape continuous like an arc from the opening side to the bottom face side. The inner face of the groove 31g, 33g may be formed into a concave shape that is a semicircle or a semiellipse in section.

As shown in FIG. 3, each of the grooves 31g is provided at a position that overlaps with portions of corresponding ones of the bottomed holes 40 in plan view. The groove 31g is formed so as to communicate with the corresponding bottomed holes 40. The groove 31g is formed so that adjacent ones of the corresponding bottomed holes 40 can communicate with each other through the groove 31g. The groove 31g is formed so as to extend along a direction in which the corresponding bottomed holes 40 are lined up in plan view. The grooves 31g are, for example, formed so as to extend in parallel with one another. Each of the grooves 31g is formed so as not to overlap with any parts of corresponding ones of the column portions 41 in plan view. That is, the groove 31g is provided at a position that does not overlap with the corresponding column portions 41 at all in plan view. The groove 31g is formed so as not to overlap with any parts of corresponding ones of the column portions 51 in plan view.

Each of the grooves 33g is provided at a position that overlaps with portions of corresponding ones of the bottomed holes 50 in plan view. The groove 33g is formed so as to communicate with the corresponding bottomed holes 50. The groove 33g is formed so that adjacent ones of the corresponding bottomed holes 50 communicate with each other through the groove 33g. The groove 33g is formed so as to extend along a direction in which the corresponding bottomed holes 50 are arranged in a line in plan view. The grooves 33g are, for example, formed so as to extend in parallel with one another. The grooves 33g are, for example, formed to extend in a direction intersecting the grooves 31g in plan view. Each of the grooves 33g is formed so as not to overlap with any parts of corresponding ones of the column portions 51 in plan view. That is, the groove 33g is provided at a position that does not overlap with the corresponding column portions 51 at all in plan view. The groove 33g is formed so as not to overlap with any parts of corresponding ones of the column portions 41 in plan view.

As shown in FIG. 2A, the bottomed holes 40 and 50 and the pores 60 formed in the metal layer 32 and the grooves 31g and 33g formed in the metal layers 31 and 33 respectively communicate with one another. A space formed by the bottomed holes 40 and 50, the pores 60, and the grooves 31g and 33g communicating with one another expands three-dimensionally. The bottomed holes 40 and 50, the pores 60, and the grooves 31g, 33g (i.e. a flow channel belonging to the porous body 20) function as the flow channel 14r through which the working fluid C (see FIG. 1) in a liquid phase flows.

Although not shown, an inlet for injecting the working fluid C (see FIG. 1) is provided in the liquid pipe 14. However, the inlet is sealed with a sealing member, and the inside of the loop heat pipe 10 is kept airtight.

The evaporator 11, the vapor pipe 12, and the condenser 13 shown in FIG. 1 are formed by the three metal layers 31 to 33 stacked on one another in a manner similar to or the same as the liquid pipe 14 shown in FIG. 2A. That is, the loop heat pipe 10 shown in FIG. 1 has a configuration in which the three metal layers 31 to 33 are stacked on one another. For example, in the evaporator 11, a porous body provided in the evaporator 11 is formed into a comb teeth shape. Inside the evaporator 11, a space is formed in a region where the porous body is absent. For example, a through hole that thicknesswise penetrates the metal layer 32, which is the inner metal layer, is formed so that the flow channel 12r is formed in the vapor pipe 12. For example, a through hole that thicknesswise penetrates the metal layer 32, which is the inner metal layer, is formed so that the flow channel 13r is formed in the condenser 13. The number of the metal layers stacked on one another is not limited to three but can be set to be four or more.

Next, effects of the loop heat pipe 10 will be described.

The loop heat pipe 10 has the evaporator 11 for vaporizing a working fluid C, the condenser 13 for condensing vapor Cv, the vapor pipe 12 for guiding the vaporized working fluid (i.e., the vapor Cv) to flow into the condenser 13, and the liquid pipe 14 for guiding the condensed working fluid C to flow into the evaporator 11.

The porous body 20 is provided in the liquid pipe 14. The porous body 20 extends from the condenser 13 to the evaporator 11 along the length direction of the liquid pipe 14. The porous body 20 guides the liquid-phase working fluid C condensed in the condenser 13 to the evaporator 11 by capillary force generated in the porous body 20.

Here, in the liquid pipe 14, as shown in FIG. 2A, the column portions 41 are provided inside the bottomed holes 40 formed in the metal layer 32, which is the inner metal layer, and the column portions 51 are provided inside the bottomed holes 50 formed in the metal layer 32. The upper faces 41A of the column portions 41 are bonded to the lower face of the metal layer 31, which is one outer metal layer, and the lower faces 51A of the column portions 51 are bonded to the upper face of the metal layer 33, which is the other outer metal layer. By bonding the column portions 41 and 51 to the metal layers 31 and 33, bonding areas between the metal layer 32 and the metal layers 31 and 33 can be increased in comparison with a case where the column portions 41 and 51 are absent. Thus, bonding strength between the metal layer 32 and the metal layers 31 and 33 can be improved.

In the present embodiment, the metal layer 31 is an example of a first outer metal layer, the metal layer 32 is an example of an inner metal layer, and the metal layer 33 is an example of a second outer metal layer. Further, the bottomed hole 40 is an example of a first bottomed hole, the column portion 41 is an example of a first column portion, the bottomed hole 50 is an example of a second bottomed hole, the column portion 51 is an example of a second column portion, the groove 31g is an example of a first groove, and the groove 33g is an example of a second groove.

Next, a method for manufacturing the loop heat pipe 10 will be described.

Figure 4A:
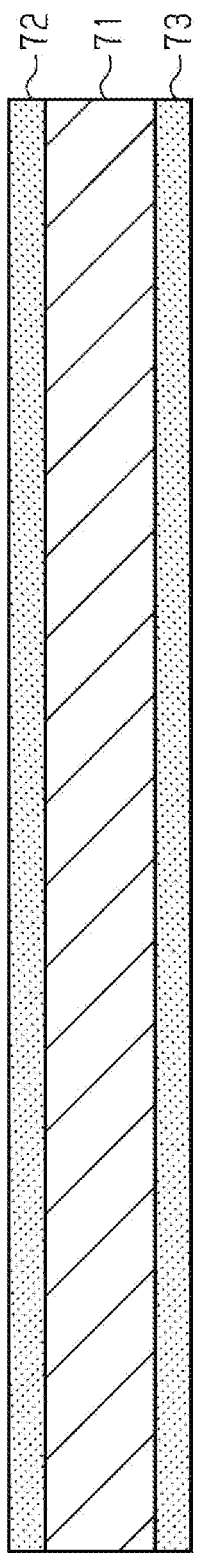
FIGS. 4A to 4D are schematic sectional views showing a method for manufacturing the loop heat pipe according to the embodiment.

First, in a step shown in FIG. 4A, a flat plate-like metal sheet 71 is prepared. The metal sheet 71 is a member that will ultimately become a metal layer 31 (see FIG. 2A). The metal sheet 71 is, for example, made of copper, stainless steel, aluminum, a magnesium alloy, or the like. Thickness of the metal sheet 71 can be, for example, set in a range of about 50 μm to 200 μm.

Subsequently, a resist layer 72 is formed on an upper face of the metal sheet 71, and a resist layer 73 is formed on a lower face of the metal sheet 71. For example, a photosensitive dry film resist, or the like, can be used as each of the resist layers 72 and 73.

Figure 4B:
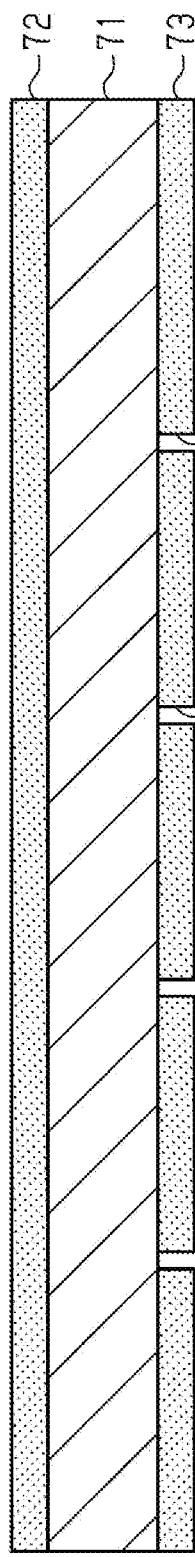

Next, in a step shown in FIG. 4B, the resist layer 73 is exposed to light and developed so that opening portions 73X for selectively exposing the lower face of the metal sheet 71 are formed in the resist layer 73. The opening portions 73X are formed so as to correspond to grooves 31g shown in FIG. 2A.

Figure 4C:
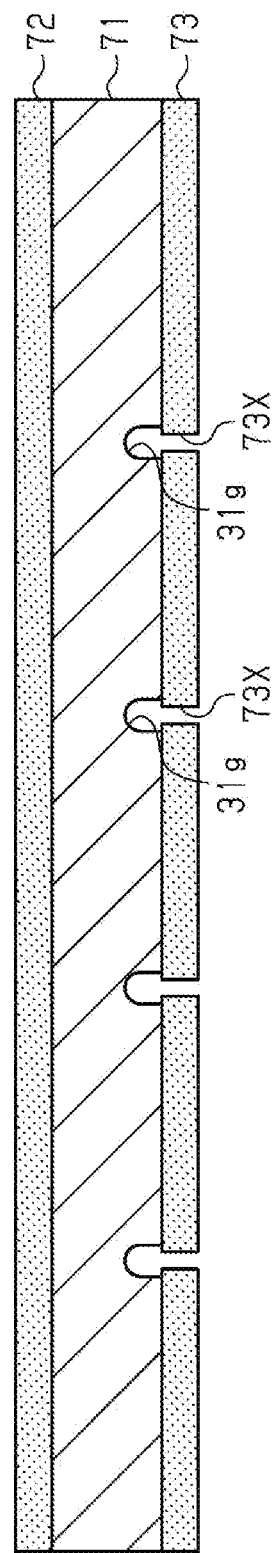

Subsequently, in a step shown in FIG. 4C, the metal sheet 71 exposed in the opening portions 73X is etched from the lower face side of the metal sheet 71. Thus, the grooves 31g are formed in the lower face of the metal sheet 71. The grooves 31g can be, for example, formed by wet etching on the metal sheet 71 using the resist layers 72 and 73 as etching masks. When copper is used as the material of the metal sheet 71, a ferric chloride aqueous solution or a cupric chloride aqueous solution can be used as an etching solution.

Figure 4D:
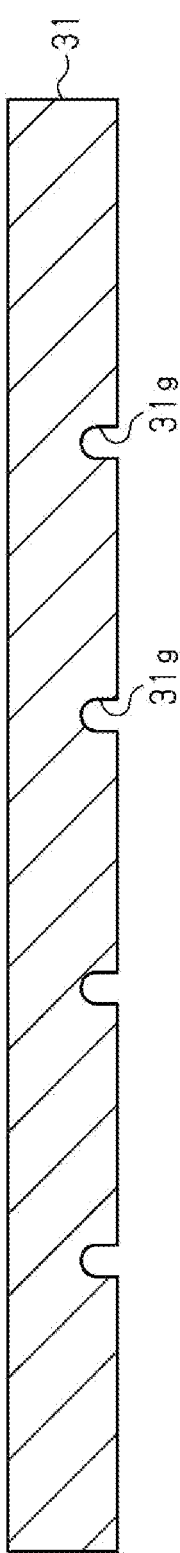
Figure 5A:
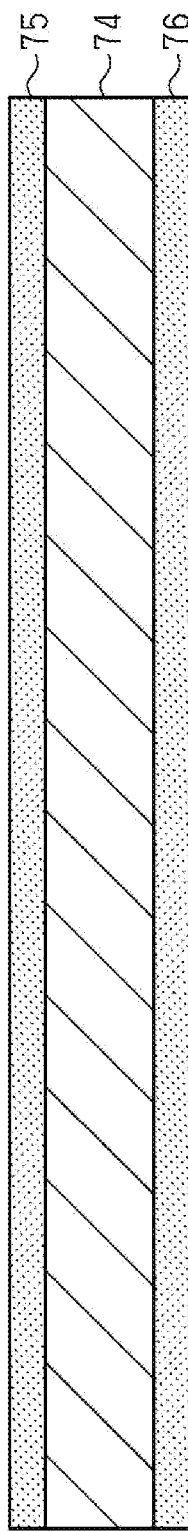
FIGS. 5A to 5D are schematic sectional views showing the method for manufacturing the loop heat pipe according to the embodiment.

Next, the resist layers 72 and 73 are stripped off using a stripping solution. Thus, the metal layer 31 having the grooves 31g in its lower face can be formed, as shown in FIG. 4D. Next, in a step shown in FIG. 5A, a flat plate-like metal sheet 74 is prepared. The metal sheet 74 is a member that will ultimately become a metal layer 33 (see FIG. 2A). The metal sheet 74 is, for example, made of copper, stainless steel, aluminum, a magnesium alloy, or the like. Thickness of the metal sheet 74 can be, for example, set in a range of about 50 μm to 200 μm.

Subsequently, a resist layer 75 is formed on an upper face of the metal sheet 74, and a resist layer 76 is formed on a lower face of the metal sheet 74. For example, a photosensitive dry film resist, or the like, can be used as each of the resist layers 75 and 76.

Figure 5B:
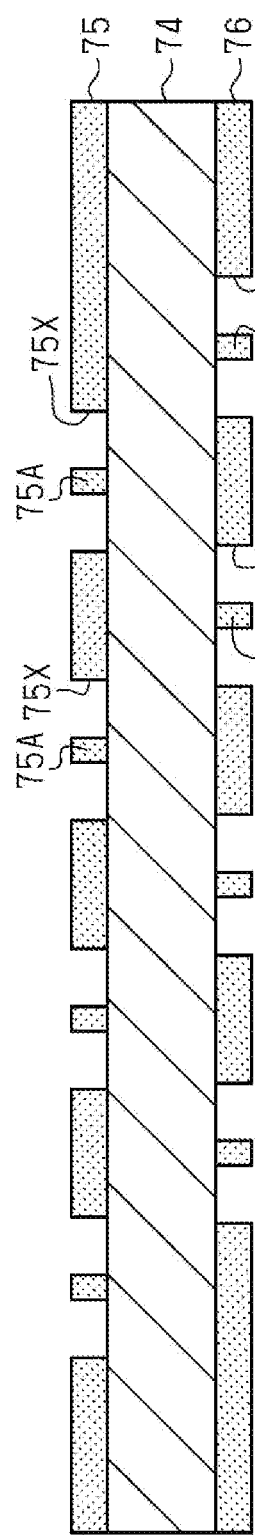

Next, in a step shown in FIG. 5B, the resist layer 75 is exposed to light and developed so that openings portions 75X for selectively exposing the upper face of the metal sheet 74 are formed in the resist layer 75. In a similar manner or the same manner, the resist layer 76 is exposed to light and developed so that opening portions 76X for selectively exposing the lower face of the metal sheet 74 are formed in the resist layer 76. The opening portions 75X are formed so as to correspond to bottomed holes 40 shown in FIG. 2A. The opening portions 76X are formed to correspond to bottomed holes 50 shown in FIG. 2A. The resist layer 75 has resist patterns 75A with which, of the upper face of the metal sheet 74, portions where column portions 41 shown in FIG. 2B will be formed are covered. The resist patterns 75A are provided inside the opening portions 75X. The resist layer 76 has resist patterns 76A with which, of the lower face of the metal sheet 74, portions where column portions 51 shown in FIG. 2B will be formed are covered. The resist patterns 76A are provided inside the opening portions 76X.

Figure 5C:
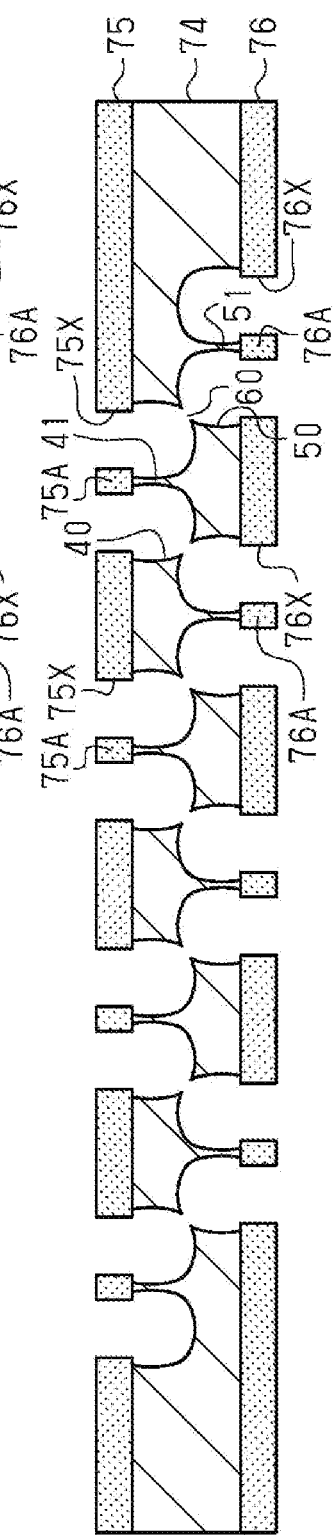

Next, in a step shown in FIG. 5C, the metal sheet 74 exposed from the resist layer 75 is etched from the upper face side of the metal sheet 74, and the metal sheet 74 exposed from the resist layer 76 is etched from the lower face side of the metal sheet 74. Due to the resist patterns 75A and the opening portions 75X, the bottomed holes 40 having the column portions 41 are formed in the upper face of the metal sheet 74. Moreover, due to the resist patterns 76A and the opening portions 76X, the bottomed holes 50 having the column portions 51 are formed in the lower face of the metal sheet 74. The bottomed holes 40 and the bottomed holes 50 are formed so as to partially overlap with each other in plan view. The pores 60 are formed at the overlapping portions where the bottomed holes 40 and the bottomed holes 50 communicate with each other. The bottomed holes 40 and 50 and the column portions 41 and 51 can be, for example, formed by wet etching on the metal sheet 74 using the resist layers 75 and 76 as etching masks. When copper is used as the material of the metal sheet 74, a ferric chloride aqueous solution or a cupric chloride aqueous solution can be used as an etching solution.

Figure 5D:
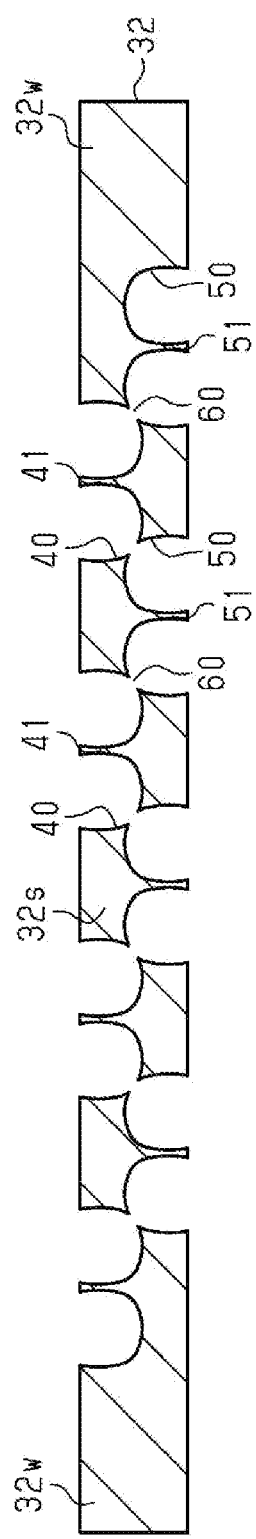

Next, the resist layers 75 and 76 are stripped off using a stripping solution. Thus, a metal layer 32 having a pair of wall portions 32w and a porous body 32s can be formed, as shown in FIG. 5D.

Subsequently, in a step shown in FIG. 6A, the metal layer 33 is formed by a method similar to or the same as the steps shown in FIGS. 4A to 4D. Then, the metal layer 32 is disposed between the metal layer 31 and the metal layer 33.

Next, in a step shown in FIG. 6B, the stacked metal layers 31 to 33 are pressed while being heated at a predetermined temperature (e.g. about 900° C.) so that the metal layers 31 to 33 are bonded to one another by solid-phase bonding. Thus, the metal layers 31, 32, and 33 adjacent in the stacking direction are directly bonded to one another. On this occasion, the lower face of the metal layer 31 and upper faces 41A of the column portions 41 are directly bonded. Here, the bottomed holes 40 and 50 and the grooves 31g and 33g are not formed in, of the metal layers 31 to 33, portions overlapping with the column portions 41 in plan view. Therefore, no space is formed in, of the metal layers 31 to 33, the portions overlapping with the column portions 41 in plan view, Thus, pressure can be suitably applied to the lower face of the metal layer 31 and the upper faces 41A of the column portions 41 during the pressing, so that the lower face of the metal layer 31 and the upper faces 41A of the column portions 41 can be suitably bonded. In a similar manner or the same manner, the upper face of the metal layer 33 and lower faces 51A of the column portions 51 are directly bonded. Here, the bottomed holes 40 and 50 and the grooves 31g and 33g are not formed in, of the metal layers 31 to 33, portions overlapping with the column portions 51 in plan view. Therefore, no space is formed in, of the metal layers 31 to 33, the portions overlapping with the column portions 51 in plan view. Thus, pressure can be suitably applied to the upper face of the metal layer 33 and the lower faces 51A of the column portions 51 during the pressing, so that the upper face of the metal layer 33 and the lower faces 51A of the column portions 51 can be suitably bonded.

By the aforementioned steps, a structure body in which the metal layers 31, 32 and 33 are stacked on one another is formed. A loop heat pipe 10 having an evaporator 11, a condenser 13, a vapor pipe 12 and a liquid pipe 14 shown in FIG. 1 is formed. On this occasion, a porous body 20 is formed in the liquid pipe 14.

After, for example, air inside the liquid pipe 14 is then exhausted by a vacuum pump or the like, a working fluid C is injected into the liquid pipe 14 from a not-shown injection port, and then, the injection port is sealed.

Next, the effects of the present embodiment will be described.

(1) The column portions 41 are provided inside the bottomed holes 40 formed in the metal layer 32, which is the inner metal layer, and the upper faces 41A of the column portions 41 are bonded to the lower face of the metal layer 31, which is the outer metal layer. Thus, the bonding area between the metal layer 31 and the metal layer 32 can be increased in comparison with a case where the column portions 41 are absent. Thus, the bonding strength between the metal layer 31 and the metal layer 32 can be improved. Therefore, when, for example, the working fluid C flowing through the liquid pipe 14 has undergone a liquid-to-solid phase change, the metal layer 31 can be prevented from being separated from the metal layer 32 even if volume expansion occurs in accordance with the phase change. That is, even in a case where the metal layer 31 is deformed so as to expand outwardly in accordance with the volume expansion, the metal layer 31 can be prevented from being separated from the metal layer 32 because the metal layer 31 and the metal layer 32 are firmly bonded to each other. Therefore, even in a case where the electronic apparatus M1 having the loop heat pipe 10 is used in an environment where the ambient, temperature is lower than the freezing point of the working fluid C, for example, in a cold region or in winter, and the working fluid C in the liquid phase freezes to cause freezing expansion, the metal layers 31 and 33 can be prevented from being separated from the metal layer 32.

(2) The column portions 51 are provided inside the bottomed holes 50 formed in the metal layer 32, which is the inner metal layer, and the lower faces 51A of the column portions 51 are bonded to the upper face of the metal layer 33, which is the outer metal layer, Thus, the bonding area between the metal layer 33 and the metal layer 32 can be increased in comparison with a case where the column portions 51 are absent. Thus, the bonding strength between the metal layer 33 and the metal layer 32 can be improved. Therefore, in the case where, for example, the working fluid C flowing through the liquid pipe 14 has undergone a liquid-to-solid phase change, the metal layer 33 can be prevented from being separated from the metal layer 32 even if volume expansion occurs in accordance with the phase change. That is, even in a case where the metal layer 33 is deformed to expand outwardly in accordance with the volume expansion, the metal layer 33 can be prevented from being separated from the metal layer 32 because the metal layer 33 and the metal layer 32 are firmly bonded to each other.

(3) The grooves 31g and 33g establishing communication between adjacent ones of the bottomed holes 40 and 50 are provided in the metal layers 31 and 33, and the inner metal layer is made up of only the single metal layer 32. Due to the grooves 31g and 33g formed thus, a space formed by the bottomed holes 40 and 50, the pores 60, and the grooves 31g and 33g communicating with one another can be expanded three-dimensionally even in the case where the inner metal layer has the single layer structure. Therefore, the inner metal layer can be made up of only the single metal layer 32, and the liquid pipe 14 can be made up of the three metal layers 31 to 33. Thus, the liquid pipe 14 can be made thinner. Hence, the loop heat pipe 10 can be made thinner.

(4) The grooves 31g are formed so as not to overlap with any parts of the column portions 41 in plan view. That is, the grooves 31g are formed so as not to overlap with the column portions 41 even partially in plan view. Therefore, the entire upper faces 41A of the column portions 41 can be bonded to the lower face of the metal layer 31. Thus, the bonding area between the metal layer 31 and the metal layer 32 can be increased in comparison with a case where the grooves 31g are formed so as to overlap with portions of the column portions 41 in plan view, that is, a case where the grooves 31g are formed so that the portions of the column portions 41 are exposed. Thus, the bonding strength between the metal layer 31 and the metal layer 32 can be further improved.

(5) Each of the column portions 41 is formed such that the thicknesswise central portion of the column portion 41 is thinner than each of the proximal end and the distal end of the column portion 41. By forming the thicknesswise central portion of the column portion 41 to be thinner, the space in the bottomed hole 40 can be secured to be wider. In addition, since the distal end of the column portion 41 is formed to be thicker than the thicknesswise central portion of the column portion 41, the upper face 41A of the column portion 41 can be formed to be wider. Thus, the bonding area between the metal layer 31 and the upper face 41A of the column portion 41 can be increased while the space in the bottomed hole 40 is secured to be wider.

OTHER EMBODIMENTS

The aforementioned embodiment may be modified and carried out as follows. The aforementioned embodiment and any of the following modifications may be carried out in combination to an extent that they are not technically inconsistent with each other.

Figure 7:
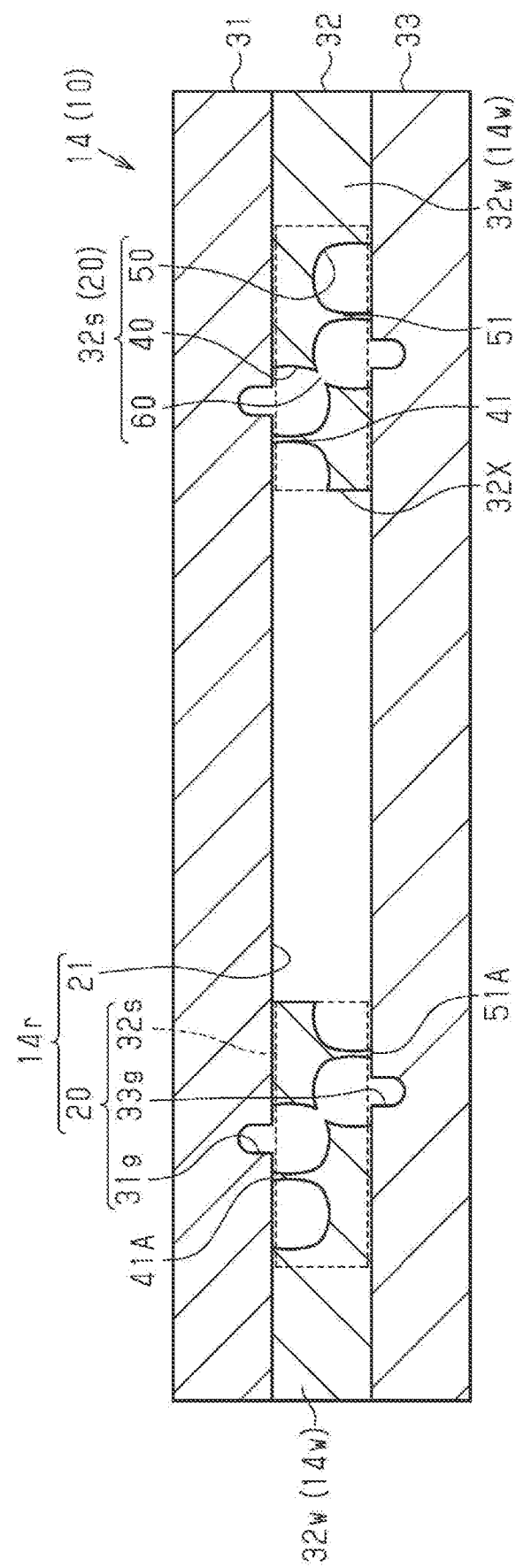
FIG. 7 is a schematic sectional view showing a loop heat pipe according to a modification.

As shown in FIG. 7, porous bodies 20 and a flow channel 21 (first flow channel) may be alternatively provided in the liquid pipe 14. The liquid pipe 14 in the present modification has a pair of pipe walls 14w, the pair of porous bodies 20 formed in continuity with the pair of pipe walls 14w, and the flow channel 21 provided between the pair of porous bodies 20. In the liquid pipe 14 in the present modification, a flow channel 14r of the liquid pipe 14 is made up of flow channels belonging to the porous bodies 20, and the flow channel 21. Incidentally, each of the porous bodies 20 is made up of a porous body 32s of a metal layer 32 and grooves 31g and 33g of metal layers 31 and 33 in a manner similar to or the same as in the aforementioned embodiment.

A sectional area of the flow channel 21 is, for example, formed to be larger than a sectional area of the flow channel belonging to the porous body 20. The flow channel 21 is made up of a through hole 32X that thicknesswise penetrates the metal layer 32, which is an inner metal layer. For example, the flow channel 21 communicates with the flow channel belonging to the porous body 20. For example, the through hole 32X communicates with at least one of bottomed holes 40 and 50 of the metal layer 32.

Even in this case, column portions 41 and 51 are provided inside the bottomed holes 40 and 50 respectively. Upper faces 41A of column portions 41 are bonded to a lower face of the metal layer 31, and lower faces 51A of the column portions 51 are bonded to an upper face of the metal layer 33.

Figure 8:
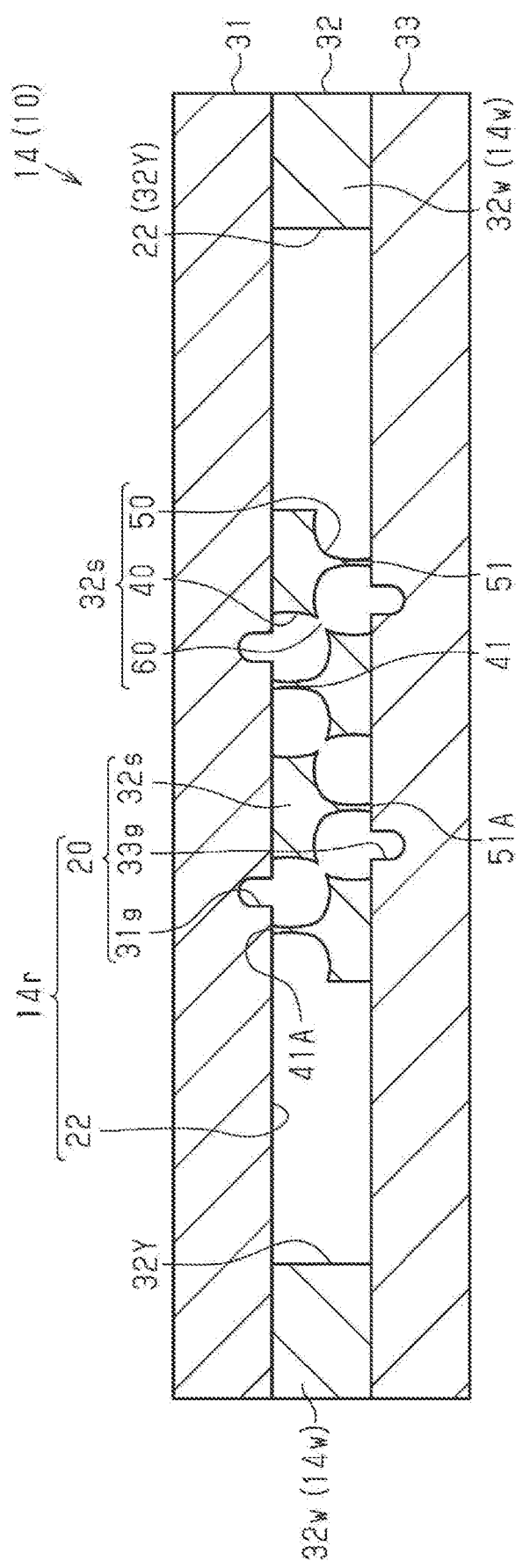
FIG. 8 is a schematic sectional view showing a loop heat pipe according to another modification.

As shown in FIG. 8, a porous body 20 and a plurality of flow channels 22 (first flow channels) may be alternatively provided in the liquid pipe 14. The liquid pipe 14 in this modification has a pair of pipe walls 14w, the porous body 20 provided apart from the pipe walls 14w, and the two flow channels 22 provided between the pipe walls 14w and the porous body 20. In the liquid pipe 14 in the present modification, a flow channel 14r of the liquid pipe 14 is made up of a flow channel belonging to the porous body 20 and the two flow channels 22. The porous body 20 in the present modification is provided at a widthwise central portion of the liquid pipe 14. The porous body 20 is provided to be isolated from the pipe walls 14w by the flow channels 22. Incidentally, the porous body 20 is made up of a porous body 32s of a metal layer 32 and grooves 31g and 33g of metal layers 31 and 33 in a manner similar to or the same as in the aforementioned embodiment.

A sectional area of each of the flow channels 22 is, for example, formed to be larger than a sectional area of the flow channel belonging to the porous body 20. The flow channel 22 is made up of a through hole 32Y that thicknesswise penetrates the metal layer 32, which is an inner metal layer. For example, the flow channel 22 communicates with the flow channel belonging to the porous body 20. For example, the through hole 32Y communicates with at least one of bottomed holes 40 and 50 of the metal layer 32.

Even in this case, column portions 41 and 51 are provided inside the bottomed holes 40 and 50 respectively, Upper faces 41A of the column portions 41 are bonded to a lower face of the metal layer 31, and lower faces 51A of the column portions 51 are bonded to an upper face of the metal layer 33.

In the aforementioned embodiment, the porous body 20 including the bottomed holes 40 and 50 having the column portions 41 and 51 is provided in the liquid pipe 14. However, the embodiment of the present disclosure is not limited thereto. For example, the porous body 20 may be provided in the evaporator 11, the vapor pipe 12 or the condenser 13. For example, it is sufficient if the porous body 20 is provided in the structure body of at least one of the evaporator 11, the vapor pipe 12, the condenser 13 and the liquid pipe 14. For example, the porous body 20 may be provided only in the vapor pipe 12.

The shapes of the bottomed holes 40 and 50 and the column portions 41 and 51 in the porous body 20 according to the aforementioned embodiment may be changed suitably in the porous body 20 according to the aforementioned embodiment, the depth of each of the bottomed holes 40 in the upper face of the metal layer 32 and the depth of each of the bottomed holes 50 in the lower face of the metal layer 32 may be different from each other.

In the aforementioned embodiment, the column portions 41 and 51 are provided inside both of the bottomed holes 40 and 50. However, the embodiment of the present disclosure is not limited thereto. For example, the column portions 41 may be alternatively provided only inside the bottomed holes 40 among the bottomed holes 40 and 50. That is, the column portions 51 may be removed. For example, the column portions 51 may be alternatively provided only inside the bottomed holes 50 among the bottomed holes 40 and 50. That is, the column portions 41 may be removed.

In the aforementioned embodiment, the column portion 41 is provided inside each of the bottomed holes 40. However, the embodiment of the present disclosure is not limited thereto. For, or example, it is sufficient if the column portion 41 is provided in at least one of the bottomed holes 40.

In the aforementioned embodiment, the column portion 51 is provided inside each of the bottomed holes 50. However, the embodiment of the present disclosure is not limited thereto. For example, it is sufficient if the column portion 51 is provided in at least one of the bottomed holes 50.

In the aforementioned embodiment, a plurality of column portions 41 may be alternatively provided inside one bottomed hole 40, and a plurality of column portions 51 may be alternatively provided inside one bottomed hole 50.

In the aforementioned embodiment, the inner metal layer is made up of only the single metal layer 32. That is, the inner metal layer has the single-layer structure. However, the embodiment of the present disclosure is not limited thereto. For example, the inner metal layer may be formed into a laminate structure in which a plurality of metal layers are stacked on one another. The inner metal layer in this case is made up of the plurality of metal layers stacked between the metal layer 31 and the metal layer 33. In addition, each of the metal layers constituting the inner metal layer has a porous body similar to or the same as the porous body 32s.

Although the preferred embodiments etc. have been described above in detail, the present disclosure is not limited to the aforementioned embodiments etc., and various modifications and substitutions can be added to the aforementioned embodiments etc. without departing from the scope described in Claims.

What is claimed is:

1. A loop heat pipe comprising:
   an evaporator that vaporizes a working fluid;
   a condenser that condenses the working fluid;
   a liquid pipe that connects the evaporator and the condenser to each other;
   a vapor pipe that connects the evaporator and the condenser to each other; and
   a loop-like flow channel that is provided in each of the evaporator, the condenser, the liquid pipe, and the vapor pipe, and through which the working fluid flows, wherein
   at least one of the evaporator, the condenser, the liquid pipe, and the vapor pipe comprises a first outer metal layer, a second outer metal layer, and an inner metal layer that is provided between the first outer metal layer and the second outer metal layer,
   the inner metal layer comprises a porous body,
   the porous body comprises:
      a first bottomed hole formed in one face of the inner metal layer;
      a second bottomed hole formed in the other face of the inner metal layer;
      a pore, wherein the first bottomed hole and the second bottomed hole partially communicates with each other through the pore; and
      a first column portion provided inside the first bottomed hole, wherein the first column portion is bonded to the first outer metal layer, and the first column portion is provided apart from an inner wall of the first bottomed hole.

2. The loop heat pipe according to claim 1, wherein:
   the inner metal layer is a single inner metal layer;
   the first outer metal layer is bonded to the one face of the inner metal layer;
   the second outer metal layer is bonded to the other face of the inner metal layer;
   the first outer metal layer comprises a first groove communicating with the first bottomed hole; and
   the second outer metal layer comprises a second groove communicating with the second bottomed hole.

3. The loop heat pipe according to claim 2, wherein:
   the first groove does not overlap with the first column portion in plan view.

4. The loop heat pipe according to claim 2, wherein:
   the porous body further comprises a second column portion provided inside the second bottomed hole; and
   the second column portion is bonded to the second outer metal layer.

5. The loop heat pipe according to claim 4, wherein:
   the second groove does not overlap with the first column portion and the second column portion in plan view.

6. The loop heat pipe according to claim 4, wherein:
   the first column portion is provided apart from an inner wall of the first bottomed hole.

7. The loop heat pipe according to claim 1, wherein:
   the first column portion comprises a proximal end connected to a bottom face of the first bottomed hole, and a distal end provided on an opposite side to the proximal end in a thickness direction of the first column portion; and
   the first column portion is formed such that a widthwise dimension of a thicknesswise central portion of the first column portion is thinner than a widthwise dimension of each of the proximal end and the distal end.

8. The loop heat pipe according to claim 7, wherein:
   a surface located at the distal end of the first column is a bonded surface to the first outer metal layer.

9. The loop heat pipe according to claim 1, wherein:
   the first column portion is provided at a center of the first bottomed hole in plan view.

10. The loop heat pipe according to claim 1, wherein:
    the liquid pipe comprises the first outer metal layer, the second outer metal layer, and the inner metal layer;
    the inner metal layer of the liquid pipe comprises the porous body, and a first flow channel that is larger in sectional area than the flow channel configured by the porous body; and
    the first bottomed hole and the second bottomed hole communicate with the first flow channel.

* * * * *